(12) United States Patent
Song

(10) Patent No.: US 10,879,488 B2
(45) Date of Patent: Dec. 29, 2020

(54) ENCAPSULATION STRUCTURE, ELECTRONIC DEVICE AND ENCAPSULATION METHOD

(71) Applicant: BOE TECHNOLOGY GROUP CO., LTD., Beijing (CN)

(72) Inventor: Yingying Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 103 days.

(21) Appl. No.: 16/215,888

(22) Filed: Dec. 11, 2018

(65) Prior Publication Data

US 2019/0305250 A1 Oct. 3, 2019

(30) Foreign Application Priority Data

Mar. 29, 2018 (CN) .......................... 2018 1 0270158

(51) Int. Cl.
*H01L 51/52* (2006.01)
*C23C 16/12* (2006.01)
(Continued)

(52) U.S. Cl.
CPC .......... *H01L 51/5253* (2013.01); *C23C 16/12* (2013.01); *C23C 16/20* (2013.01); *C23C 16/22* (2013.01); *C23C 16/403* (2013.01); *C23C 16/45525* (2013.01); *C23C 16/45555* (2013.01); *C23C 16/56* (2013.01); *C23C 16/0272* (2013.01); *C23C 16/308* (2013.01); *C23C 16/345* (2013.01); *Y10T 428/1259* (2015.01); *Y10T 428/12535* (2015.01); *Y10T 428/12542* (2015.01); *Y10T 428/12549* (2015.01); *Y10T 428/12556* (2015.01); *Y10T 428/12569* (2015.01); *Y10T 428/12611* (2015.01);
(Continued)

(58) Field of Classification Search
None
See application file for complete search history.

(56) References Cited

U.S. PATENT DOCUMENTS 5,925,417 A * 7/1999 Fousse .................. B05D 1/185
427/352
6,495,247 B1 * 12/2002 Takezawa .............. B05D 1/185
427/352
(Continued)

FOREIGN PATENT DOCUMENTS

| CN | 1485377 A | 3/2004 |
|---|---|---|
| CN | 104103660 A * | 10/2014 |

(Continued)

OTHER PUBLICATIONS

Machine Translation of CN 105304685 A, dated Feb. 2016 (Year: 2016).*

(Continued)

*Primary Examiner* — Jeffrey A Vonch
(74) *Attorney, Agent, or Firm* — Collard & Roe, P.C.

(57) ABSTRACT

An encapsulation structure, an encapsulation method and an electronic device are provided. The encapsulation structure includes an inorganic layer, an aluminum carbon layer and an organic layer. The aluminum carbon layer is on the inorganic layer and contacts with the inorganic layer; the organic layer is on the aluminum carbon layer and contacts with the aluminum carbon layer.

20 Claims, 8 Drawing Sheets

(51) Int. Cl.
    C23C 16/20    (2006.01)
    C23C 16/22    (2006.01)
    C23C 16/40    (2006.01)
    C23C 16/455   (2006.01)
    C23C 16/56    (2006.01)
    C23C 16/34    (2006.01)
    C23C 16/02    (2006.01)
    C23C 16/30    (2006.01)
(52) U.S. Cl.
    CPC ............ Y10T 428/12625 (2015.01); Y10T
            428/12667 (2015.01); Y10T 428/12764
        (2015.01); Y10T 428/31536 (2015.04); Y10T
                                428/31678 (2015.04)

(56) References Cited

U.S. PATENT DOCUMENTS

| | | | | |
|---|---|---|---|---|
| 6,506,616 | B1* | 1/2003 | Kim | H01L 51/0018 438/22 |
| 10,446,780 | B1* | 10/2019 | Jin | H01L 51/0034 |
| 2006/0199025 | A1* | 9/2006 | Hanson | H01J 9/20 428/469 |
| 2008/0305360 | A1* | 12/2008 | Han | H01L 51/5256 428/690 |
| 2009/0081360 | A1* | 3/2009 | Fedorovskaya | H01L 51/5262 427/160 |
| 2009/0081883 | A1* | 3/2009 | Freeman | C23C 16/45553 438/765 |
| 2010/0164369 | A1* | 7/2010 | Yeh | H01L 51/5256 313/504 |
| 2010/0178481 | A1* | 7/2010 | George | C23C 28/00 428/213 |
| 2010/0200846 | A1* | 8/2010 | Kwack | H01L 51/5253 257/40 |
| 2010/0244068 | A1* | 9/2010 | van Rens | H01L 51/5256 257/98 |
| 2011/0114992 | A1* | 5/2011 | Schmid | H01L 51/5256 257/100 |
| 2011/0236660 | A1* | 9/2011 | Murakami | B32B 7/02 428/213 |
| 2012/0199872 | A1* | 8/2012 | Chen | H01L 51/5256 257/100 |
| 2013/0320509 | A1* | 12/2013 | Kobrin | B81B 3/0075 257/642 |
| 2013/0333835 | A1* | 12/2013 | Carcia | H01L 51/448 156/280 |
| 2013/0337259 | A1* | 12/2013 | Carcia | C09D 5/00 428/336 |
| 2014/0030494 | A1* | 1/2014 | Chan | B32B 9/04 428/213 |
| 2014/0048780 | A1* | 2/2014 | Song | H01L 51/56 257/40 |
| 2014/0065739 | A1* | 3/2014 | Chen | H01L 51/56 438/26 |
| 2014/0132150 | A1* | 5/2014 | You | H05B 33/10 313/504 |
| 2014/0141191 | A1* | 5/2014 | Lee | H01G 9/2077 428/76 |
| 2014/0225084 | A1* | 8/2014 | Oh | H01L 51/56 257/40 |
| 2014/0264297 | A1* | 9/2014 | Kumar | H01L 51/5253 257/40 |
| 2015/0072119 | A1* | 3/2015 | George | C23C 16/0272 428/212 |
| 2015/0115235 | A1* | 4/2015 | Lee | H01L 27/3244 257/40 |
| 2015/0249229 | A1* | 9/2015 | Song | H01L 51/56 257/40 |
| 2015/0275349 | A1* | 10/2015 | Matsui | B32B 7/12 428/200 |
| 2016/0365538 | A1* | 12/2016 | Qian | H01L 51/56 |
| 2017/0009034 | A1* | 1/2017 | Suzuki | H01J 37/32899 |
| 2017/0077450 | A1* | 3/2017 | Kim | H01L 51/0097 |
| 2017/0145177 | A1* | 5/2017 | Vollkommer | C08J 5/18 |
| 2017/0346040 | A1* | 11/2017 | Fleissner | H01L 51/5203 |
| 2017/0365624 | A1* | 12/2017 | Sasaki | H01L 29/42384 |
| 2018/0226612 | A1* | 8/2018 | Choi | H01L 51/5253 |
| 2018/0248153 | A1* | 8/2018 | Cui | H01L 27/3244 |
| 2018/0294438 | A1* | 10/2018 | Lee | H01L 51/5256 |
| 2019/0019985 | A1* | 1/2019 | Cai | H01L 51/5246 |
| 2019/0036077 | A1* | 1/2019 | Hirase | H01L 51/524 |
| 2019/0077120 | A1* | 3/2019 | Kim | H01L 51/5243 |
| 2019/0148671 | A1* | 5/2019 | Mu | H01L 51/56 257/40 |
| 2019/0302499 | A1* | 10/2019 | Yu | G02F 1/133308 |
| 2019/0326536 | A1* | 10/2019 | Jin | H01L 51/0097 |
| 2019/0355933 | A1* | 11/2019 | Guo | H01L 51/56 |
| 2020/0044187 | A1* | 2/2020 | Jin | H01L 51/0035 |

FOREIGN PATENT DOCUMENTS

| | | | | |
|---|---|---|---|---|
| CN | 104518095 | A | | 4/2015 |
| CN | 104846350 | A | * | 8/2015 |
| CN | 105304685 | A | * | 2/2016 |
| CN | 105336761 | A | | 2/2016 |
| CN | 105977394 | A | * | 9/2016 |
| CN | 106158901 | A | * | 11/2016 |
| CN | 106299153 | A | * | 1/2017 |
| CN | 106450035 | A | * | 2/2017 |
| CN | 106711345 | A | * | 5/2017 |
| CN | 107123753 | A | * | 9/2017 |
| CN | 107302014 | A | * | 10/2017 |
| JP | 2005254712 | A | * | 9/2005 |
| WO | WO-2012039310 | A1 | * | 3/2012 ............ H05B 33/10 |
| WO | WO-2018192277 | A1 | * | 10/2018 ............ H01L 51/56 |

OTHER PUBLICATIONS

Machine Translation of CN 107302014 A, dated Oct. 2017 (Year: 2017).*
Dollinger et al., Multilayer Aluminum Thin Films as Effective Encapsulation for Flexible Organic Devices, May 2015, ScienceOpen Posters (Year: 2015).*
Hossbach et al., Integration of molecular-layer-deposited aluminum alkoxide interlayers into inorganic nanolaminate barriers for encapsulation of organic electronics with improved stress resistance, Nov. 2014, Journal of Vacuum Science & Technology A, (Year: 2014).*
Yang et al., Realization of Thin Film Encapsulation by Atomic Layer Deposition of Al2O3 at Low Temperature, Aug. 2013, The Journal of Physical Chemistry C, pp. 20308-20312 (Year: 2013).*
Healy et al., Synthesis and molecular structure of {[N(CH2CH2O)3]Al2(CH3)3}12: the first six-coordinate aluminum alkyl, Jan. 1989, Journal of the American Chemical Society, pp. 398-399 (Year: 1989).*
McMahon et al., Reaction of Al(tBu)3 with Ethylene Glycol: Intermediates to Aluminum Alkoxide (Alucone) Preceramic Polymers, Oct. 1999, Chemistry of Materials, vol. 11, Issue 11, pp. 3181-3188 (Year: 1999).*
Dameron et al., Molecular Layer Deposition of Alucone Polymer Films Using Trimethylaluminum and Ethylene Glycol, Apr. 2008, Chemistry of Materials, vol. 20, Issue 10, pp. 3315-3326 (Year: 2008).*
Feng-Bo et al., Fabrication of tunable [Al2O3:Alucone] thin-film encapsulations for top-emitting organic light-emitting diodes with high performance optical and barrier properties, Oct. 2014, Organic Electronics, vol. 15, Issue 10, pp. 2546-2552 (Year: 2014).*
George et al., Metalcones: Hybrid Organic-Inorganic Films Fabricated Using Atomic and Molecular Layer Deposition Techniques, Aug. 2011, Journal of Nanoscience and Nanotechnology, vol. 11, Issue 9, pp. 7948-7955 (Year: 2011).*
Park et al., Gas diffusion barrier characteristics of Al2O3/alucone films formed using trimethylaluminum, water and ethylene glycol for organic light emitting diode encapsulation, Nov. 2013, Thin Solid Films, vol. 546, Issue 1, pp. 153-156 (Year: 2013).*

(56) References Cited

OTHER PUBLICATIONS

Chinese Office Action in Chinese Application No. 201810270158.9, dated Jul. 1, 2019 with English translation.
Chinese Office Action in Chinese Application No. 201810270158.9, dated Oct. 19, 2020 with English translation.

* cited by examiner plasma treatment

ENCAPSULATION STRUCTURE, ELECTRONIC DEVICE AND ENCAPSULATION METHOD

The application claims priority to the Chinese patent application No. 201810270158.9, filed on Mar. 29, 2018, the entire disclosure of which is incorporated herein by reference as part of the present application.

TECHNICAL FIELD

Embodiments of the present disclosure relate to an encapsulation structure, an encapsulation method, and an electronic device.

BACKGROUND

Some electronic devices (for example, OLED devices) have a poor ability of resisting water vapor and oxygen, and if these electronic devices are exposed to water vapor or oxygen, the lifetimes of these electronic devices decrease. As for encapsulation of the electronic devices, an advanced encapsulation technology is thin film encapsulation technology. For example, an encapsulation structure is formed by a plurality of inorganic encapsulation layers overlapping with each other, or by an inorganic encapsulation layer and an organic encapsulation layer overlapping with each other.

SUMMARY

At least one embodiment of the present disclosure provides an encapsulation structure, and the encapsulation structure includes an inorganic layer, an aluminum carbon layer and an organic layer. The aluminum carbon layer is on the inorganic layer and contacts with the inorganic layer; the organic layer is on the aluminum carbon layer and contacts with the aluminum carbon layer.

For example, in the encapsulation structure provided by at least one embodiment of the present disclosure, the aluminum carbon layer comprises $(R((CH_2)_mO)_n)_3Al$, both m and n are positive integers, and R is alkyl or phenyl, m=2, n=1~6.

For example, in the encapsulation structure provided by at least one embodiment of the present disclosure, the inorganic layer comprises an aluminum oxide layer, and the aluminum carbon layer is on the aluminum oxide layer and contacts with the aluminum oxide layer.

For example, in the encapsulation structure provided by at least one embodiment of the present disclosure, the inorganic layer comprises a first inorganic layer and an aluminum metal layer on the first inorganic layer, and the aluminum carbon layer is on the aluminum metal layer and contacts with the aluminum metal layer.

For example, in the encapsulation structure provided by at least one embodiment of the present disclosure, the first inorganic layer includes aluminum oxide.

For example, in the encapsulation structure provided by at least one embodiment of the present disclosure, the inorganic layer further comprises a second inorganic layer at a side, away from the aluminum carbon layer, of the first inorganic layer.

At least one embodiment of the present disclosure provides an electronic device, and the electronic device includes any one of the encapsulation structures provided by embodiments of the present disclosure.

At least one embodiment of the present disclosure provides an encapsulation method, and the encapsulation method includes forming an inorganic layer; forming an aluminum carbon layer, in which the aluminum carbon layer is on the inorganic layer and contacts with the inorganic layer; and forming an organic layer, in which the organic layer is on the aluminum carbon layer and contacts with the aluminum carbon layer.

For example, in the encapsulation method provided by at least one embodiment of the present disclosure, after forming the inorganic layer, the encapsulation method includes: forming an aluminum film, in which the aluminum film is on the inorganic layer and contacts with the inorganic layer; forming an organic material layer, in which the organic material layer is on the aluminum film and contacts with the aluminum film; and performing a process of heating, so that the aluminum film reacts with the organic material layer to form the aluminum carbon layer and the organic layer.

For example, in the encapsulation method provided by at least one embodiment of the present disclosure, the inorganic layer comprises an aluminum oxide layer, and the aluminum carbon layer is on the aluminum oxide layer and contacts with the aluminum oxide layer.

For example, in the encapsulation method provided by at least one embodiment of the present disclosure, all of the aluminum film reacts with the organic material layer to form the aluminum carbon layer and the organic layer.

For example, in the encapsulation method provided by at least one embodiment of the present disclosure, the inorganic layer comprises a first inorganic layer and an aluminum metal layer on the first inorganic layer, and the aluminum carbon layer is on the aluminum metal layer and contacts with the aluminum metal layer.

For example, in the encapsulation method provided by at least one embodiment of the present disclosure, the aluminum film is on the first inorganic layer, one portion, close to the organic material layer, of the aluminum film reacts with the organic material layer to form the aluminum carbon layer and the organic layer, and the other portion, close to the first inorganic layer, of the aluminum film does not react with the organic material layer; the other portion, which does not react with the organic material layer, of the aluminum film is used as the aluminum metal layer.

For example, in the encapsulation method provided by at least one embodiment of the present disclosure, the first inorganic layer comprises aluminum oxide.

For example, in the encapsulation method provided by at least one embodiment of the present disclosure, the organic material layer comprises a group $—((CH_2)_mO—)_n$, and both m and n are positive integers; the aluminum film reacts with the group $—((CH_2)_mO—)_n$ on a surface, contacting with the aluminum film, of the organic material layer to form the aluminum carbon layer.

For example, in the encapsulation method provided by at least one embodiment of the present disclosure, the organic material layer comprises an organic solvent, and the organic solvent comprises the group $—((CH_2)_mO—)_n$.

For example, in the encapsulation method provided by at least one embodiment of the present disclosure, m=2, n=1~6.

For example, the encapsulation method provided by at least one embodiment of the present disclosure includes: performing the process of heating, so that the organic material layer is solidified and the aluminum film reacts with the organic material layer to form the aluminum carbon layer and the organic layer at the same time.

For example, in the encapsulation method provided by at least one embodiment of the present disclosure, the performing the process of heating includes: performing a process of vacuum heating.

For example, the encapsulation method provided by at least one embodiment of the present disclosure further includes: performing a plasma treatment on the inorganic layer after forming the inorganic layer.

For example, in the encapsulation method provided by at least one embodiment of the present disclosure, forming the inorganic layer further includes: forming a second inorganic layer at a side, away from the aluminum carbon layer, of the first inorganic layer.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "In," "outside", "on," "under," and the like are only used to indicate relative position relationship, and when the position of the object which is described is changed, the relative position relationship may be changed accordingly.

The figures used to describe the embodiments of the present disclosure are not drawn according to actual proportions or scales, and specific sizes and amounts of structures in the figures can be determined according to actual requirements. The figures of the embodiments of the present disclosure are only schematic views.

Figure 1:
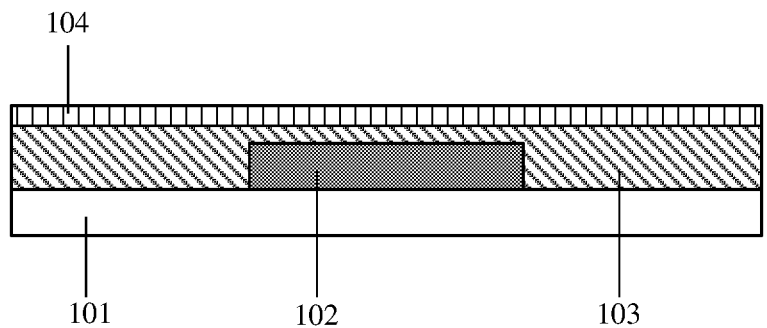
FIG. 1 is a structural schematic diagram of an encapsulation structure.

FIG. 1 is a structural schematic diagram of an encapsulation structure. As illustrated in FIG. 1, the encapsulation structure includes a base substrate 101, an electronic element 102, an inorganic encapsulation layer 103 and an organic encapsulation layer 104. The electronic element 102 is on the base substrate 101, the inorganic encapsulation layer 103 covers the electronic element 102, and the organic encapsulation layer 104 is on the inorganic encapsulation layer 103. In use of the encapsulation structure, due to poor ductility of the inorganic encapsulation layer 103, the inorganic encapsulation layer 103 is more prone to cracking compared with the organic encapsulation layer 104. In addition, a bonding strength between the inorganic encapsulation layer 103 and the organic encapsulation layer 104 is low, which is not beneficial to releasing stresses in the bending process of the inorganic encapsulation layer 103, and thus cracks are easily generated in the inorganic encapsulation layer 103 so that external moisture, oxygen, etc., contact the electronic device through the cracks, thus the lifetime of the electronic device is reduced.

At least one embodiment of the present disclosure provides an encapsulation structure, and the encapsulation structure includes an inorganic layer, an aluminum carbon layer and an organic layer. The aluminum carbon layer is on the inorganic layer and contacts with the inorganic layer; the organic layer is on the aluminum carbon layer and contacts with the aluminum carbon layer.

Figure 2A:
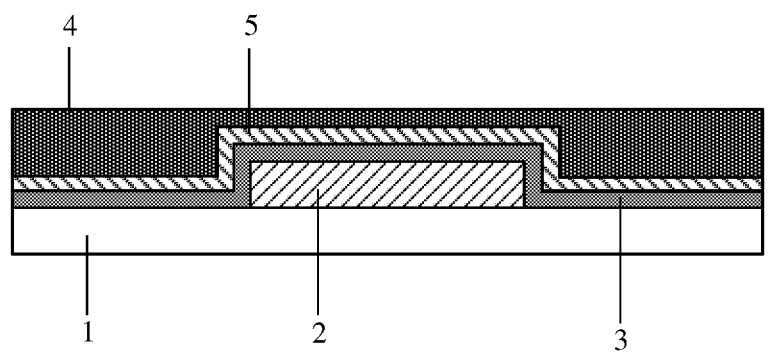
FIG. 2A is a structural schematic diagram of an encapsulation structure provided by at least one embodiment of the present disclosure.

For example, FIG. 2A is a structural schematic diagram of the encapsulation structure provided by at least one embodiment of the present disclosure. As illustrated in FIG. 2A, the encapsulation structure 10 includes a base substrate 1, an electronic element 2, an inorganic layer, an aluminum carbon layer 5 and an organic layer 4. For example, the base substrate 1 is a glass substrate or a quartz substrate, etc. For example, the base substrate 1 is a flexible substrate, for example, a material of the flexible substrate is polyimide. Of course, the material of the flexible substrate is not limited to the types listed above, and limitations are not imposed to the material of the flexible substrate. The electronic element 2 is on the base substrate 1. For example, the electronic element 2 is an organic light emitting diode (OLED) device or other electronic element that needs to be sealed. The inorganic layer includes a first inorganic layer 3, and the first inorganic layer 3 is on the base substrate 1 and covers the electronic element 2 and at least a portion of the base substrate 1, so that a sealing of the electronic device 2 is achieved. The aluminum carbon layer 5 is on the first inorganic layer 3 and contacts with the first inorganic layer 3. For example, in the embodiment illustrated in FIG. 2A, the aluminum carbon layer 5 covers the first inorganic layer 3. The organic layer 4 is on the aluminum carbon layer 5 and contacts with the aluminum carbon layer 5. The inorganic layer has a strong ability of blocking moisture (for example, water vapor) and oxygen, the organic layer has a good ductility and helps the inorganic layer to release stresses, therefore, in a bending process of the encapsulation structure, the encapsulation structure (including the inorganic layer and the organic layer) is less prone to cracks, thus the encapsulation structure maintains a good sealing effect and adapts to a flexible device better. In the encapsulation structure 10 provided by at least one embodiment of the present disclosure, the aluminum carbon layer 5 is between the first inorganic layer 3 and the organic layer 4, and the aluminum carbon layer 5 contacts with both of the first inorganic layer 3 and the organic layer 4. Because both a bonding strength between the aluminum carbon layer 5 and the first inorganic layer 3 and a bonding strength between the aluminum carbon layer 5 and the organic layer 4 are greater than a bonding strength between the first inorganic layer 3 and the organic layer 4 in a case where the first inorganic layer 3 directly contacts with the organic layer 4. Therefore, in the encapsulation structure 10 provided by at least one embodiment of the present disclosure, the aluminum carbon layer 5 increases the bonding strength between the first inorganic layer and the organic layer. Compared with the encapsulation structure illustrated in FIG. 1, in a bending process of the first inorganic layer 3, on one hand, the encapsulation structure provided by at least one embodiment of the present disclosure alleviates or prevents delamination and warpage in the encapsulation structure; on the other hand, the first inorganic layer 3 releases stresses caused by bending and deformation in conjunction with the aluminum carbon layer 5 and the organic layer 4 better, thus a problem of the cracks in the first inorganic layer 3 is alleviated or prevented, which is beneficial to prevent the external moisture (for example, water vapor), oxygen and other substances from contacting with the electronic element through the cracks in the inorganic layer, thus the lifetime of the electronic element is extended. Therefore, the encapsulation method provided by at least one embodiment of the present disclosure obtains a better encapsulation effect. And in the encapsulation method provided by at least one embodiment of the present disclosure, for example, the aluminum carbon layer 5 is formed by a reaction of aluminum with the organic material layer used for forming the organic layer 4, and bonding forces between the aluminum carbon layer 5 and the organic layer 4 include a chemical bonding force. However, in a common encapsulation structure in which the organic layer is provided (for example, by coating) on the inorganic layer and the inorganic layer contacts with the organic layer, a bonding force between the inorganic layer and the organic layer is an electrostatic adsorption force, such as van Edward force, and the bonding force between the inorganic layer and the organic layer does not include a chemical bonding force. It should be noted that, under the same conditions, a bonding strength of bonding the aluminum carbon layer and the organic layer by the chemical bonding force is greater than a bonding strength of bonding the aluminum carbon layer and the organic layer by the electrostatic adsorption force. Therefore, compared with the encapsulation structure in which the organic layer is provided (for example, by coating) on the inorganic layer and the inorganic layer contacts with the organic layer, a bonding strength between the aluminum carbon layer 5 and the organic layer 4 in the encapsulation structure provided by at least one embodiment of the present disclosure is higher, thus the bonding strength between the inorganic layer and the organic layer is increased.

For example, in the embodiment illustrated in FIG. 2A, the inorganic layer includes only the first inorganic layer 3.

For example, the aluminum carbon layer 5 includes $(R((CH2)_mO)_n)_3Al$, both m and n are positive integers, and R is alkyl or phenyl. For example, m=2 and n=1~6, in this case, during manufacturing the aluminum carbon layer 5, a reaction of producing an aluminum carbon material used for forming the aluminum carbon layer 5 proceeds more successfully, thus the required aluminum carbon layer 5 is obtained better. For example, in a case where m=2 and n=4, the aluminum carbon layer 5 includes $(R(CH_2CH_2O)_4)_3Al$.

For example, in a group $—((CH_2)_mO—)_n$, m=2 and n=1~6, in this case, during manufacturing the aluminum carbon layer 5 using the material of the organic layer 4, the reaction of producing the aluminum carbon material for forming the aluminum carbon layer 5 proceed more successfully, thus the required aluminum carbon layer 5 is obtained better.

For example, the organic layer 4 includes a resin material. For example, the resin material is a thermosetting resin, for example, unsaturated polyester resin, epoxy resin, phenolic resin, etc. For example, the resin material is a light-solidifying resin, for example, polyester acrylic resin or vinyl ether resin, etc. Of course, the organic layer is not limited to including the resin material, the resin material is not limited to the above listed types, and limitations are not imposed to the material of the organic layer.

For example, the organic layer 4 is formed by an organic solution, and a solvent of the organic solution includes the group $(—(CH_2)_mO—)_n$.

For example, the first inorganic layer 3 includes aluminum oxide, that is, the inorganic layer includes an aluminum oxide layer, and the aluminum carbon layer 5 is on the aluminum oxide layer and contacts with the aluminum oxide layer. Chemical properties of aluminum oxide are stable, thus aluminum oxide is not easy to be corroded and achieves a better encapsulation effect; moreover, aluminum oxide has a good heat resisting property, and the encapsulation layer made of aluminum oxide maintains stable properties and achieves a better encapsulation effect when the electronic element releases heat during working; in addition, aluminum oxide has a good ductility, so that in the bending process of the encapsulation structure, the aluminum oxide layer is not prone to cracking, thus the encapsulation structure achieves a good sealing effect, and a flexible encapsulation structure with a good sealing effect is obtained, thus a flexible device with a good sealing effect is obtained by utilizing the flexible encapsulation structure. For example, the flexible device is a flexible display panel. In addition, in the embodiments of the present disclosure, in a case where the first inorganic layer 3 includes aluminum oxide, the bonding strength between the first inorganic layer 3 and the aluminum carbon layer 5 is further increased.

For example, the first inorganic layer 3 includes a material besides aluminum oxide. For example, the first inorganic layer 3 includes at least one of silicon nitride, silicon oxide, and silicon oxynitride. Of course, the material of the first inorganic layer 3 is not limited to the above listed types, and limitations are not imposed to the material of the first inorganic layer 3.

Figure 2B:
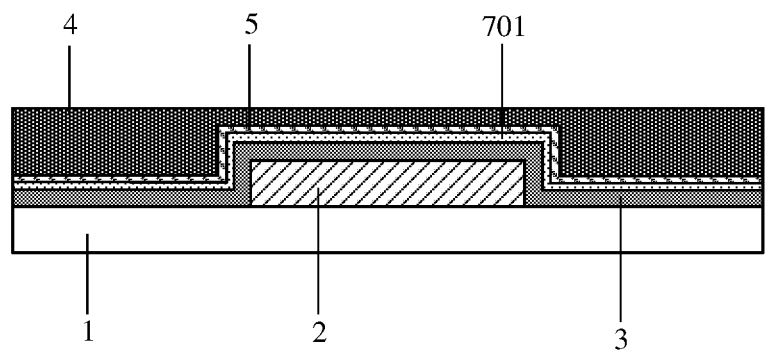
FIG. 2B is another structural schematic diagram of the encapsulation structure provided by at least one embodiment of the present disclosure.

FIG. 2B is another structural schematic diagram of the encapsulation structure provided by at least one embodiment of the present disclosure. The difference between the encapsulation structure illustrated in FIG. 2B and the encapsulation structure illustrated in FIG. 2A is that the inorganic layer includes the first inorganic layer 3 and an aluminum metal layer 701 on the first inorganic layer 3, and the aluminum carbon layer 5 is on the aluminum metal layer 701 and contacts with the aluminum metal layer 701 in FIG. 2B. In an encapsulation process, the metal layer 701 for example is used for forming the aluminum carbon layer 5. In the embodiment illustrated in FIG. 2B, the aluminum carbon layer 5 increases a bonding strength between the aluminum metal layer 701 and the organic layer 4 while achieving a same technical effect as that of the embodiment illustrated in FIG. 2A; for example, the aluminum carbon layer 5 is formed by a reaction of aluminum atoms close to the organic layer 4 in the aluminum metal layer 701 with the organic material layer used for forming the organic layer 4, thus bonding forces between the aluminum metal layer 701 and the aluminum carbon layer 5 include a chemical bonding force, for example, a chemical bonding effect (for example, an ionic bonding effect) exists between the aluminum atoms in the aluminum metal layer 701 and a molecule $(R(CH_2CH_2O)_4)_3Al$ in the aluminum carbon layer 5. However, in a common encapsulation structure which is formed by providing an aluminum carbon layer on the aluminum metal layer (the aluminum carbon layer has been already formed before providing the aluminum carbon layer on the aluminum metal layer), a bonding force between the aluminum metal layer and the aluminum carbon layer is an electrostatic adsorption force, such as van Edward force, and such bonding force between the aluminum metal layer and the aluminum carbon layer does not include a chemical bonding force. It should be noted that, under the same conditions, a bonding strength of bonding the aluminum metal layer and the aluminum carbon layer by the chemical bonding force is greater than a bonding strength of bonding the aluminum metal layer and the aluminum carbon layer by the electrostatic adsorption force. Therefore, compared with the above-mentioned encapsulation structure which is formed by providing the aluminum carbon layer on the aluminum metal layer (the aluminum carbon layer has been already formed before providing the aluminum carbon layer on the aluminum metal layer), the bonding strength between aluminum metal layer 701 and the aluminum carbon layer 5 in the encapsulation structure provided by at least one embodiment of the present disclosure is higher, thus the bonding strength between the inorganic layer and the organic layer is increased.

Figure 3A:
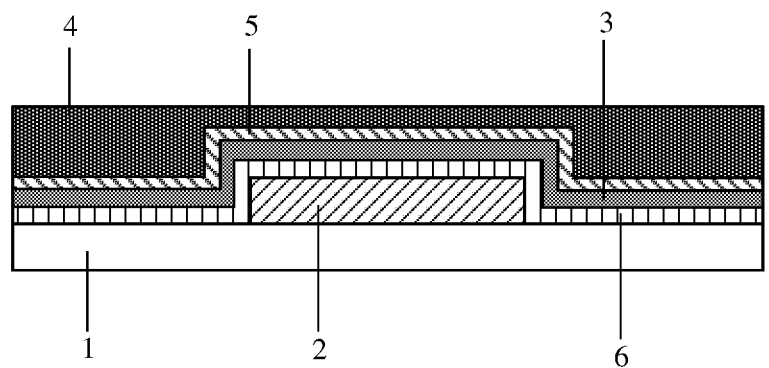
FIG. 3A is further another structural schematic diagram of the encapsulation structure provided by at least one embodiment of the present disclosure.

In another embodiment of the present disclosure, the inorganic layer of the encapsulation structure for example includes a plurality of inorganic layers which are stacked. FIG. 3A is further another structural schematic diagram of the encapsulation structure provided by at least one embodiment of the present disclosure. The difference between the encapsulation structure 10 illustrated in FIG. 3A and the encapsulation structure illustrated in FIG. 2A is as follows. The encapsulation structure 10 illustrated in FIG. 3A further includes a second inorganic layer 6, and the second inorganic layer 6 is at a side, away from the aluminum carbon layer 5, of the first inorganic layer 3 and covers the electronic element 2. The first inorganic layer 3 is on the second inorganic layer 6 and contacts with the second inorganic layer 6. Other features not mentioned herein of the encapsulation structure 10 illustrated in FIG. 3A are the same as those of the encapsulation structure illustrated in FIG. 2A. The stack arrangement of the first inorganic layer 3 and the second inorganic layer 6 further improves the ability of the encapsulation structure to isolate moisture and oxygen. The aluminum carbon layer 5 increases the bonding strength between the inorganic layer and the organic layer 4, and the inorganic layer includes the first inorganic layer 3 and the second inorganic layer 6, thus the encapsulation structure illustrated in FIG. 3A achieves a same or similar technical effects as the encapsulation structure illustrated in FIG. 2A, and the technical effects may be referred to the descriptions above, no repeat herein. For example, the second inorganic layer 6 is different from the first inorganic layer 3; for example, the second inorganic layer 6 includes at least one of silicon nitride, silicon oxide and silicon oxynitride, and the first inorganic layer 3 includes aluminum oxide.

Figure 3B:
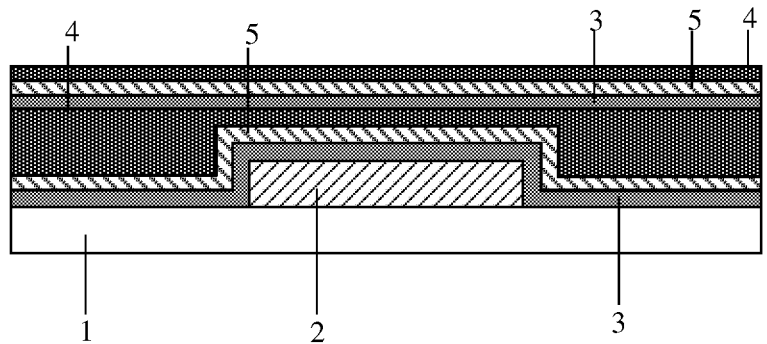
FIG. 3B is further another structural schematic diagram of the encapsulation structure provided by at least one embodiment of the present disclosure.

FIG. 3B is further another structural schematic diagram of the encapsulation structure provided by at least one embodiment of the present disclosure. Taking a structure formed by sequentially stacking the first inorganic layer 3, the aluminum carbon layer 5 and the organic layer 4 as an encapsulation layer unit, the difference between the encapsulation structure illustrated in FIG. 3B and the encapsulation structure illustrated in FIG. 2A is that the encapsulation structure 10 in FIG. 3B includes two encapsulation layer units mentioned above, so that the sealing effect of the electronic element in the encapsulation structure 10 is further improved. Of course, in other embodiments of the present disclosure, the encapsulation structure 10 for example includes more than two stacked encapsulation layer units, and the amount of the encapsulation layer units is not limited to that illustrated in FIG. 3B.

It should be noted that the technical features of the encapsulation structure provided by the embodiments of the present disclosure can be combined, and different embodiments can also be combined.

Figure 4:
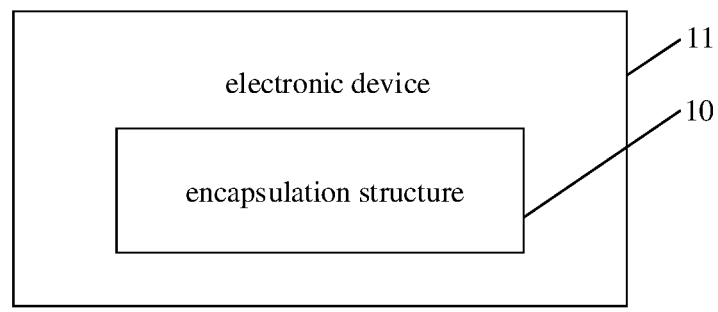
FIG. 4 is a structural schematic diagram of an electronic device provided by at least one embodiment of the present disclosure.

At least one embodiment of the present disclosure provides an electronic device, and the electronic device includes any one of the encapsulation structures provided by embodiments of the present disclosure. For example, FIG. 4 is a structural schematic diagram of the electronic device provided by one embodiment of the present disclosure. As illustrated in FIG. 4, the electronic device 11 includes any one of the encapsulation structures 10 provided by embodiments of the present disclosure. For example, the electronic device is a display device, for example, an OLED display device. For example, the display device is a flexible display device. For example, the display device includes any products or components having display function as follows: a mobile phone, a panel computer, a TV set, a display, a laptop, a digital photo frame, a navigation instrument or the like. For example, the electronic device 11 is a lighting device, such as an OLED lighting device. For example, the lighting device is a decorative lantern, a flexible lighting device, etc. Of course, limitations are not imposed to the type of the electronic device in the embodiments of the present disclosure.

It should be noted that FIG. 4 is only a structural schematic diagram of any one of the electronic devices provided by the embodiments of the present disclosure, as for other structures or components not mentioned of the electronic device, those skilled in the art can refer to the common techniques, and limitations are not imposed to this.

At least one embodiment of the present disclosure provides an encapsulation method, and the encapsulation method includes: forming an inorganic layer; forming an aluminum carbon layer, and the aluminum carbon layer is on the inorganic layer and contacts with the inorganic layer; and forming an organic layer, and the organic layer is on the aluminum carbon layer and contacts with the aluminum carbon layer.

Figure 5A:
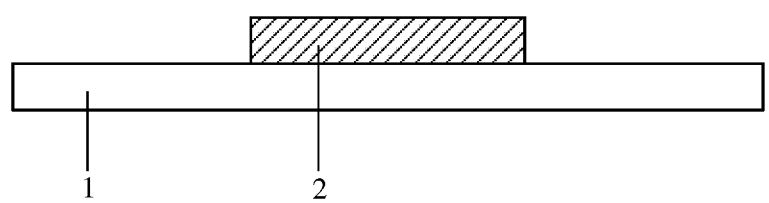
FIG. 5A-5H are schematic diagrams of an encapsulation method provided by at least one embodiment of the present disclosure.

For example, FIG. 5A-5H are schematic diagrams of the encapsulation method provided by at least one embodiment of the present disclosure. In this embodiment, the inorganic layer includes a first organic layer 3. As illustrated in FIG. 5A, a base substrate 1 provided with an electronic element 2 is provided. For example, the base substrate 1 is a glass substrate or a quartz substrate, etc. For example, the base substrate 1 is a flexible substrate, for example, a material of the flexible substrate is polyimide. Of course, the material of the base substrate 1 is not limited to the types listed above, and limitations are not imposed to the material of the base substrate 1. For example, the electronic element 2 is an organic light emitting diode (OLED) device or other electronic elements that need to be sealed.

Figure 5B:
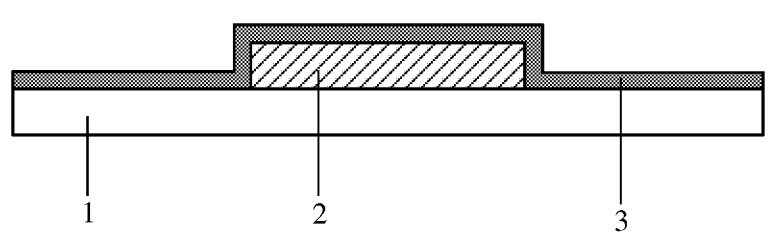

As illustrated in FIG. 5B, the first organic layer 3 covering the electronic element 2 is formed, so that the electronic element 2 is sealed. For example, the first organic layer 3 further covers at least a portion of the base substrate 1. For example, the first inorganic layer 3 is formed by a method of atomic layer deposition (ALD). The method of ALD controls the thickness of the film formed better and is not sensitive to changes of temperature and reactant flux. Thus, the film obtained has a high purity, a high density, a high smoothness and a high shape-preserving property. The first inorganic layer 3 formed by ALD possesses a better sealing performance and thus produces a more stable sealing effect. In addition, for example, most ALD processes are carried out below 400 degrees Celsius, which is beneficial to reduce an energy consumption and production costs. Of course, the first inorganic layer 3 may be formed by a method of chemical vapor deposition or magnetron sputtering deposition, etc., and limitations are not imposed to this.

For example, a material used for forming the first inorganic layer 3 includes aluminum oxide. Chemical properties of aluminum oxide are stable, thus aluminum oxide is not easy to be corroded and thus achieves a better encapsulation effect; moreover, aluminum oxide has a good heat resisting property, and the encapsulation layer made of aluminum oxide maintains stable properties and achieves a better encapsulation effect when the electronic element releases heat during working; in addition, aluminum oxide has a good ductility, so that in the bending process of the encapsulation structure, the aluminum oxide layer is not prone to cracking, thus the encapsulation structure achieves a good sealing effect, and a flexible encapsulation structure with a good sealing effect is obtained, thus a flexible device with a good sealing effect is obtained by utilizing the flexible encapsulation structure. For example, the flexible device is a flexible display panel. In addition, in the embodiments of the present disclosure, in a case where the first inorganic layer 3 includes aluminum oxide, the bonding strength between the first inorganic layer 3 and the aluminum carbon layer 5 is further increased.

For example, the material used for forming the first inorganic layer 3 includes a material besides aluminum oxide. For example, the first inorganic layer 3 includes at least one of silicon nitride, silicon oxide, and silicon oxynitride. Of course, the material of the first inorganic layer 3 is not limited to the above listed types, and limitations are not imposed to the material of the first inorganic layer 3.

Figure 5C:
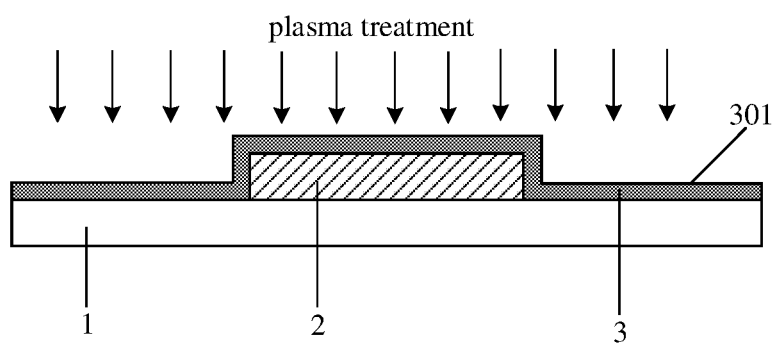

As illustrated in FIG. 5C, after forming the first inorganic layer 3, a plasma treatment on the first inorganic layer 3 is performed. It should be noted that the plasma treatment increases the roughness of a first surface 301, which is used to contact with a subsequently formed aluminium film or aluminium metal layer, of the first inorganic layer 3. For example, pits visible or invisible to naked eyes are formed on the first surface 301 of the first inorganic layer 3. In this way, a contact area between the aluminium film or the aluminium metal layer and the first inorganic layer 3 increases after the aluminium film or the aluminium metal layer contacting with the first surface 301 of the first inorganic layer 3 is subsequently formed, thus a bonding strength between a subsequently formed aluminum carbon layer and the first inorganic layer 3 is increased, or a bonding strength between the subsequently formed aluminium film or the aluminum metal layer and the first inorganic layer 3 is increased. In this way, different encapsulation layers are bonded more firmly and are not prone to cracking and warping, so that a better encapsulation effect is achieved.

Figure 5D:
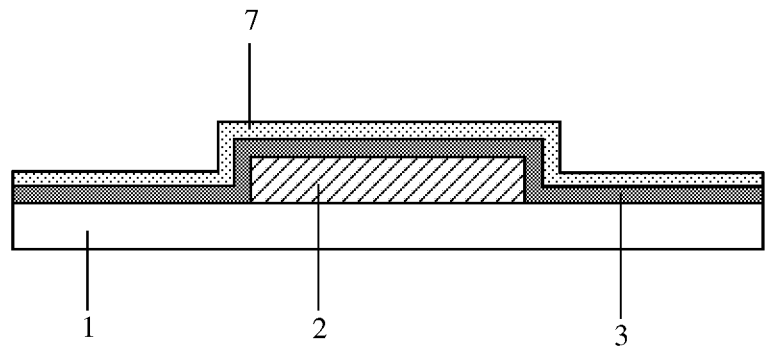

As illustrated in FIG. 5D, after forming the first inorganic layer 3, for example, after finishing the process illustrated in FIG. 5B or FIG. 5C, an aluminium film is formed. The aluminium film 7 is formed on the first inorganic layer 3 and contacts with the first inorganic layer 3. For example, the aluminium film 7 is formed by a method of atomic layer deposition (ALD) or a method of chemical vapor deposition or magnetron sputtering deposition, etc. Of course, limitations are not imposed to the method of forming the aluminium film. For example, a thickness of the aluminium film 7 is 10-100 nm. If the aluminum film is too thin, it is not beneficial to form the aluminum carbon layer with an appropriate thickness, and if the aluminum film 7 is too thick, it is not beneficial to thin the encapsulation structure.

Figure 5E:
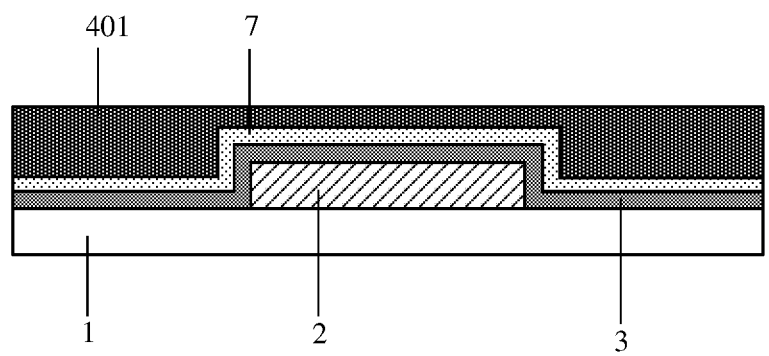

As illustrated in FIG. 5E, an organic material layer 401 is formed, and the organic material layer 401 is on the aluminium film 7 and contacts with the aluminium film 7. For example, the organic material layer 401 includes a group —$((CH_2)_mO—)_n$, both m and n are positive integers. For example, m=2 and n=1~6. For example, the organic material layer 401 includes an organic solvent. For example, organic solvent molecules are adsorbed on a surface, contacting with the aluminium film, of the organic material layer 401. The organic solvent includes the group —$((CH_2)_mO—)_n$. For example, the organic solvent includes $R((CH_2)_mO—)_n$, R is alkyl or phenyl, and both m and n are positive integers. For example, the organic solvent includes alcohols. Taking that R is methyl, m=2 and n=1 as an example, at least one component of the organic solvent is propyl alcohol. The organic material layer 401 for example further includes a resin material. For example, the resin material and the organic solvent are made into an organic solution, and then the organic solution is coated on the aluminium film 7 to form the organic material layer 401. For example, the resin material is a thermosetting resin, for example, unsaturated polyester resin, epoxy resin, phenolic resin, etc. For example, the resin material is a light-solidifying resin, for example, polyester acrylic resin or vinyl ether resin, etc. Of course, the organic material layer is not limited to including the resin material, the resin material is not limited to the above listed types, and limitations are not imposed to the material of the organic material layer 401.

Figure 5F:
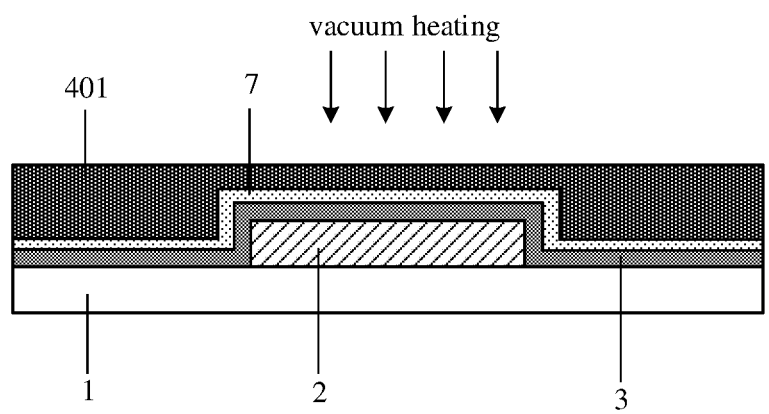
Figure 5G:
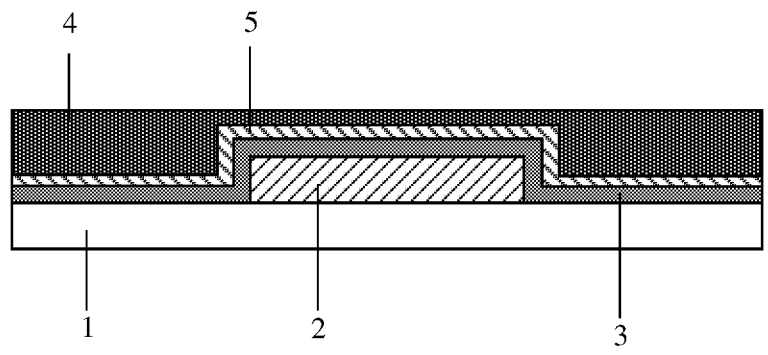

As illustrated in FIG. 5F, a process of heating is performed, so that the aluminum film 7 reacts with the organic material layer 401 to form an aluminum carbon layer 5 and an organic layer 4 illustrated in FIG. 5G For example, the aluminum film 7 reacts with the group —$((CH_2)_mO—)_n$ on the surface, contacting with the aluminium film 7, of the organic material layer 401 to produce an aluminum carbon material, and the aluminum carbon layer 5 is made of the aluminum carbon material. For example, all of the aluminum film 7 reacts with the organic material layer 401 to form the aluminum carbon layer 5 and the organic layer 4. All of elementary substance aluminum of the aluminum film 7 reacts with the organic material layer 401 to form the encapsulation structure illustrated in FIG. 5G In the encapsulation structure, for example, the first inorganic layer 3 is an aluminum oxide, that is, the inorganic layer includes an aluminum oxide, and the aluminum carbon layer 5 is on the aluminum oxide layer and contacts with the aluminum oxide layer. In the encapsulation structure illustrated in FIG. 5G, the aluminum carbon layer 5 is on the first inorganic layer 3 and contacts with the first inorganic layer 3. The organic layer 4 is on the aluminum carbon layer 5 and contacts with the aluminum carbon layer 5. In the encapsulation method provided by the at least one embodiment of the present disclosure, the aluminum carbon layer 5 is formed between the first inorganic layer 3 and the organic layer 4, and the aluminum carbon layer 5 contacts with both of the first inorganic layer 3 and the organic layer 4. Because both a bonding strength between the aluminum carbon layer 5 and the first inorganic layer 3 and a bonding strength between the aluminum carbon layer 5 and the organic layer 4 are greater than a bonding strength between the first inorganic layer 3 and the organic layer 4 in a case where the first inorganic layer 3 directly contacts with the organic layer 4. Therefore, the aluminum carbon layer 5 increases the bonding strength between the first inorganic layer and the organic layer. On one hand, the encapsulation method provided by at least one embodiment of the present disclosure alleviates or prevents delamination and warpage in the encapsulation structure; on the other hand, the first inorganic layer 3 releases stresses caused by bending and deformation in conjunction with the aluminum carbon layer 5 and the organic layer 4 better, thus a problem of the cracks in the first inorganic layer 3 is alleviated or prevented, which is beneficial to preventing the external moisture (for example, water vapor), oxygen and other substances from contacting the electronic device through the cracks in the inorganic layer, thus the lifetime of the electronic device is extended. Moreover, in the encapsulation method provided by at least one embodiment of the present disclosure, the aluminum carbon layer 5 is formed by a reaction of aluminum with the organic material layer used for forming the organic layer 4, and bonding forces between the aluminum carbon layer 5 and the organic layer 4 include a chemical bonding force. However, in a common encapsulation structure in which the organic layer is provided (for example, by coating) on the inorganic layer and the inorganic layer contacts with the organic layer, a bonding force between the inorganic layer and the organic layer is an electrostatic adsorption force, such as van Edward force, and the bonding force between the inorganic layer and the organic layer does not include a chemical bonding force. It should be noted that, under the same conditions, a bonding strength of bonding the aluminum carbon layer and the organic layer by the chemical bonding force is greater than a bonding strength of bonding the aluminum carbon layer and the organic layer by the electrostatic adsorption force. Therefore, compared with the encapsulation structure in which the organic layer is provided (for example, by coating) on the inorganic layer and the inorganic layer contacts with the inorganic layer, a bonding strength between the aluminum carbon layer 5 and the organic layer 4 in the encapsulation structure formed by the encapsulation method provided by at least one embodiment of the present disclosure as illustrated in FIG. 5G is higher, thus the bonding strength between the inorganic layer and the organic layer is increased.

For example, in the process illustrated in FIG. 5F, in a case where the electronic element 2 needs to be isolated from oxygen to prevent damages of oxygen, the process of heating is a process of vacuum heating. For example, the process of vacuum heating is carried out in a vacuum heating furnace. In this case, a chemical equation of the reaction is as follows.

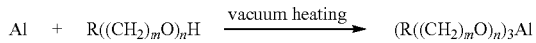

$$Al + R((CH_2)_mO)_nH \xrightarrow{\text{vacuum heating}} (R((CH_2)_mO)_n)_3Al$$

For example, m=2, n=1~6, in this case, it is beneficial for the reaction to proceed more successfully so that the required aluminum carbon layer 5 is obtained better. Taking a case where m=2 as an example, the chemical equation of the reaction is as follows.

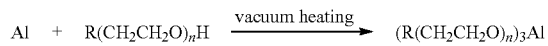

$$Al + R(CH_2CH_2O)_nH \xrightarrow{\text{vacuum heating}} (R(CH_2CH_2O)_n)_3Al$$

For example, the organic material layer 401 formed in the process illustrated in FIG. 5E is in a non solidified state. For example, during the process of heating mentioned above, the organic material layer 401 is solidified and the aluminum film 7 reacts with the organic material layer 401 to form the aluminum carbon layer 5 and the organic layer 4 at the same time. In a case where the resin material in the organic material layer 401 is a thermosetting resin, during the process of heating mentioned above, the organic material layer 401 is solidified, thus the organic layer 4 in a solidified state is obtained. That is, the aluminum carbon layer 5 is formed by the chemical reaction, at the same time, the organic material layer 401 is solidified, and the organic layer 4 is obtained. In this way, an extra solidification process of the organic material layer 401 is not necessary, so that the encapsulation process is simplified and an efficiency of production is improved.

Figure 5H:
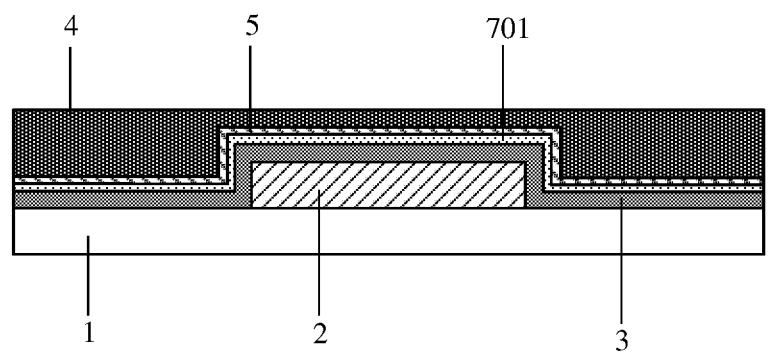

For example, during the reaction, one portion, close to the organic material layer 401, of the aluminum film 7 reacts with the organic material layer 401, and the other portion, close to the first inorganic layer 3, of the aluminum film 7 does not react with the organic material layer 401; the portion, which does not react with the organic material layer, of the aluminum film 7 is formed as an aluminum metal layer 701. In this case, the encapsulation structure as illustrated in FIG. 5H is formed, the encapsulation structure further includes the aluminum metal layer 701 on the first inorganic layer 3, and the aluminum carbon layer 5 is on the aluminum metal layer 701 and contacts with the aluminum metal layer 701. In this case, a same technical effect as that of the embodiment illustrated in FIG. 5A-5G is achieved; in addition, because the aluminum carbon layer 5 is formed by a reaction of aluminum atoms close to the organic layer 4 in the aluminum metal layer 701 with the organic material layer used for forming the organic layer 4, bonding forces between the aluminum metal layer 701 and the aluminum carbon layer 5 also include a chemical bonding force, for example, a chemical bonding effect (for example, an ionic bonding effect) exists between the aluminum atoms in the aluminum metal layer 701 and a molecule $(R(CH_2CH_2O)_4)_3Al$ in the aluminum carbon layer 5. However, in a common encapsulation structure which is formed by providing an aluminum carbon layer on the aluminum metal layer (the aluminum carbon layer has been already formed before providing the aluminum carbon layer on the aluminum metal layer), a bonding force between the aluminum metal layer and the aluminum carbon layer is an electrostatic adsorption force, such as van Edward force, and the bonding force between the organic layer and the inorganic layer does not include a chemical bonding force. It should be noted that, under the same conditions, a bonding strength of bonding the aluminum metal layer and the aluminum carbon layer by the chemical bonding force is greater than a bonding strength of bonding the aluminum metal layer and the aluminum carbon layer by the electrostatic adsorption force. Therefore, compared with the above-mentioned encapsulation structure which is formed by providing the aluminum carbon layer on the aluminum metal layer (the aluminum carbon layer has been already formed before providing the aluminum carbon layer on the aluminum metal layer), a bonding strength between aluminum metal layer 701 and the aluminum carbon layer 5 in the encapsulation structure formed by the encapsulation method provided by at least one embodiment of the present disclosure, as illustrated in FIG. 5H, is higher, thus the bonding strength between the organic layer and the inorganic layer is increased.

Figure 6A:
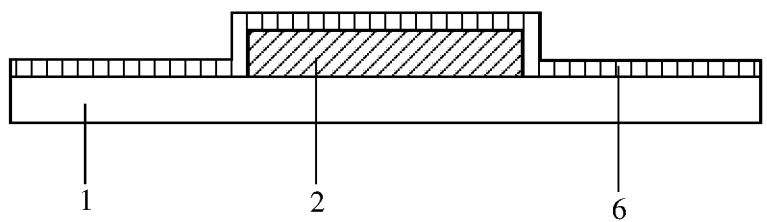
FIG. 6A-6H are another schematic diagrams of the encapsulation method provided by at least one embodiment of the present disclosure.

FIG. 6A-6H are another schematic diagrams of the encapsulation method provided by at least one embodiment of the present disclosure. In this embodiment, the inorganic layer includes the first inorganic layer and a second inorganic layer stacked with each other. As illustrated in FIG. 6A, based on providing the structure illustrated in FIG. 5A, the encapsulation method includes forming a second inorganic layer 6 before forming the first inorganic layer 3. The second inorganic layer 6 contacts with the electronic element 2. The method of forming the second inorganic layer 6 may be referred to the method of forming the first inorganic layer 3 as the descriptions in the embodiments above.

Figure 6B:
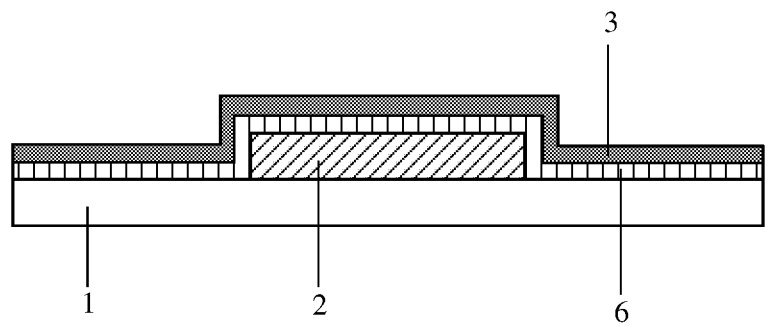

As illustrated in FIG. 6B, after the second inorganic layer 6 is formed, the first inorganic layer 3 is formed. The stack arrangement of the first inorganic layer 3 and the second inorganic layer 6 further improves the ability of the encapsulation structure to isolate moisture and oxygen. For example, the second inorganic layer 6 is different from the first inorganic layer 3; for example, the second inorganic layer 6 includes at least one of silicon nitride, silicon oxide and oxysilicon nitride, and the first inorganic layer 3 includes aluminum oxide.

Figure 6C:
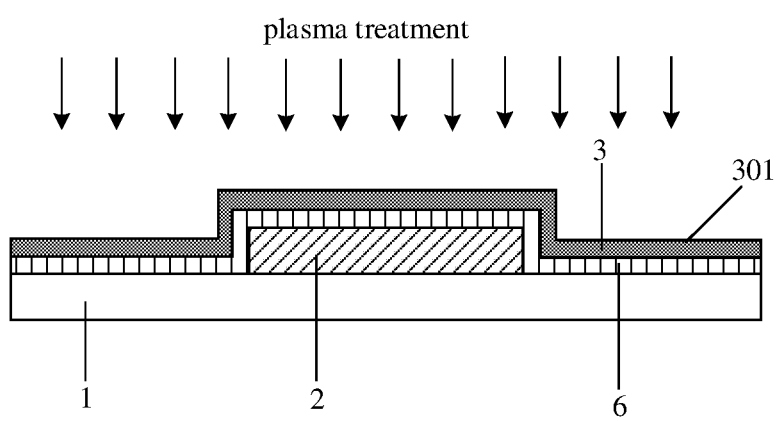

As illustrated in FIG. 6C, a plasma treatment on the inorganic layer is performed after forming the inorganic layer. It should be noted that the plasma treatment increases the roughness of a first surface 301, which is used to contact with a subsequently formed aluminium film or aluminium metal layer, of the first inorganic layer 3. For example, pits visible or invisible to naked eyes are formed on the first surface 301 of the first inorganic layer 3. In this way, a contact area between the aluminium film or the aluminium metal layer and the first inorganic layer 3 increases after the aluminium film or the aluminium metal layer contacting with the first surface 301 of the first inorganic layer 3 is subsequently formed, thus a bonding strength between a subsequently formed aluminum carbon layer and the first inorganic layer 3 is increased, or a bonding strength between the subsequently formed aluminium film or the aluminum metal layer and the first inorganic layer 3 is increased. In this way, different encapsulation layers are bonded more firmly and are not prone to cracking and warping, so that a better encapsulation effect is achieved.

Figure 6D:
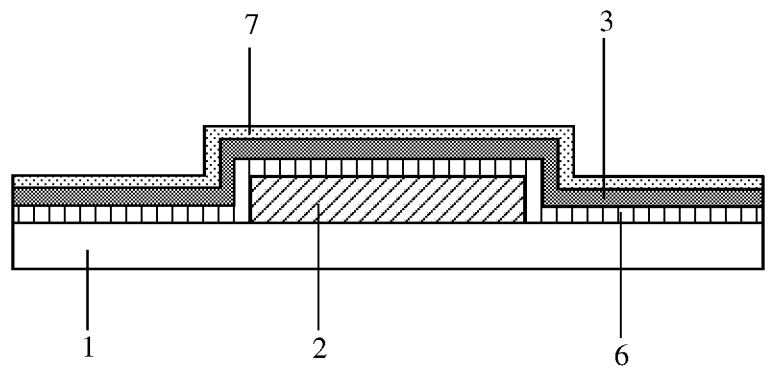
Figure 6E:
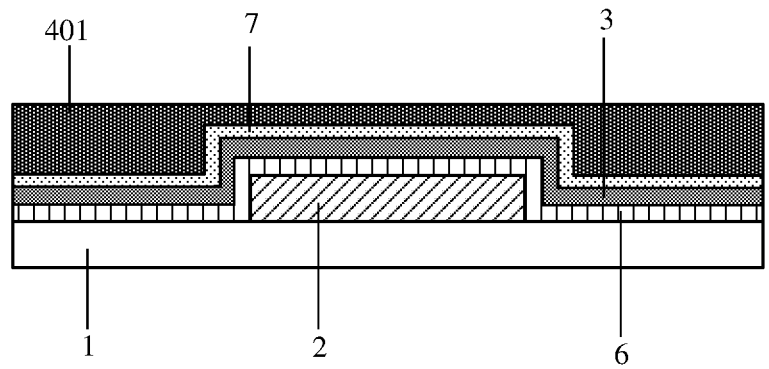
Figure 6F:
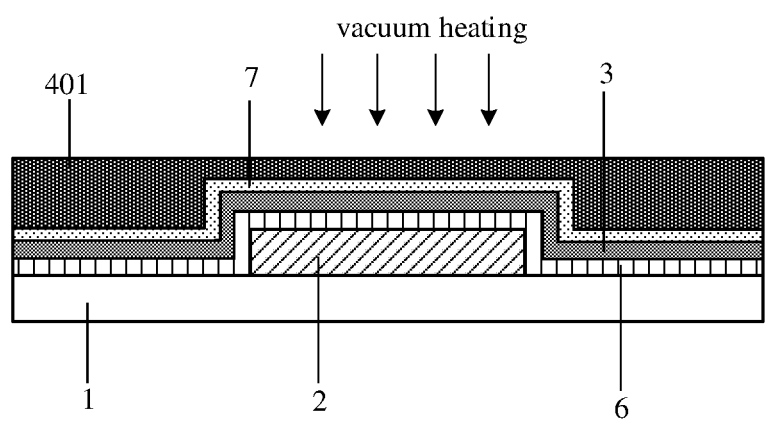
Figure 6G:
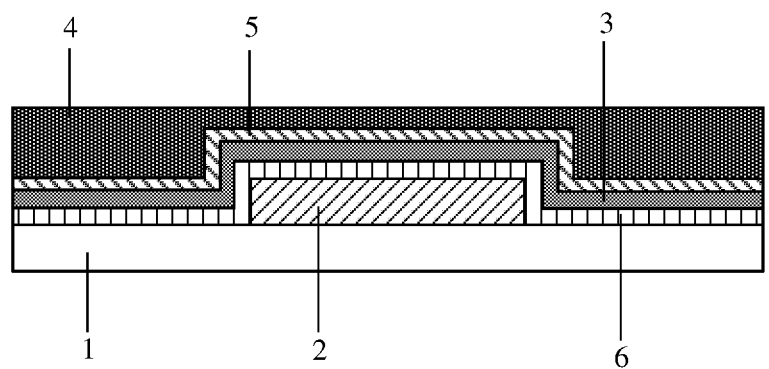
Figure 6H:
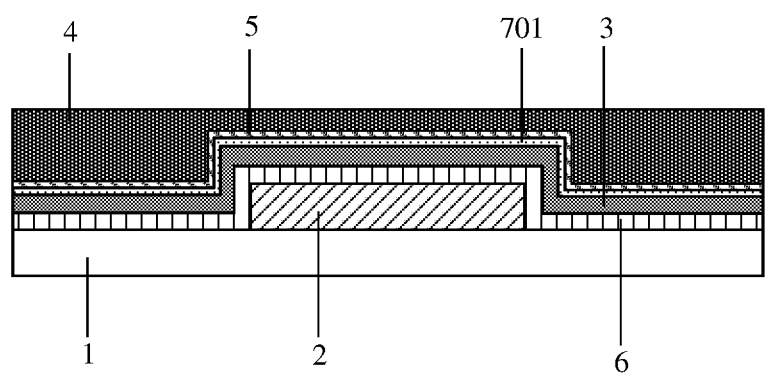

As illustrated in FIG. 6D, the aluminium film 7 is formed on the second inorganic layer 6, and the aluminium film 7 contacts with the first inorganic layer 3. The specific method of forming the aluminium film 7 is the same as that illustrated in FIG. 5D. The subsequent steps are illustrated in FIG. 6E-6H, and the subsequent steps illustrated in FIG. 6E-6H are respectively the same as those illustrated in FIG. 5E-5H, which may be referred to the descriptions above, no repeat herein.

It should be noted that in the encapsulation method provided by different embodiments of the present disclosure, the technical features may be combined with each other.

What have been described above are only specific implementations of the present disclosure, the protection scope of the present disclosure is not limited thereto. The protection scope of the present disclosure should be based on the protection scope of the claims.

What is claimed is:

1. An encapsulation structure, comprising:
   an inorganic layer,
   an aluminum carbon layer on and in contact with the inorganic layer; and
   an organic layer on and in contact with the aluminum carbon layer,
   wherein the aluminum carbon layer comprises $(R((CH_2)_m, O)_n)_3$ Al, both m and n are positive integers and R is alkyl or phenyl, wherein the aluminum carbon layer and the organic layer are formed via reaction of an aluminum film with an organic material layer on and in contact with the aluminum film, wherein the aluminum film is formed on and in contact with the inorganic layer.

2. The encapsulation structure according to claim 1, wherein m=2 and n=1~6.

3. The encapsulation structure according to claim 1, wherein the inorganic layer comprises an aluminum oxide layer, and the aluminum carbon layer is on and in contacts with the aluminum oxide layer.

4. The encapsulation structure according to claim 1, wherein all of the aluminum film is reacted, wherein the aluminum-carbon layer is on and in direct contact with the inorganic layer.

5. The encapsulation structure according to claim 1, wherein only a portion of aluminum film adjacent the organic layer is reacted and a remaining portion of the aluminum film adjacent the inorganic layer remains unreacted forming an aluminum metal layer on and in contact with the inorganic layer, wherein the aluminum carbon layer is on and in contact with the aluminum metal layer, and wherein the inorganic layer comprises a first inorganic layer and the aluminum metal layer is on and in contact with the first inorganic layer.

6. The encapsulation structure according to claim 5, wherein the first inorganic layer comprises aluminum oxide.

7. The encapsulation structure according to claim 5, wherein the inorganic layer further comprises a second organic layer different from the first inorganic layer at a side of the first inorganic layer opposite the aluminum carbon layer.

8. The encapsulation structure according to claim 7, wherein the first inorganic layer comprises aluminum oxide and the second inorganic layer comprises at least one of silicon nitride, silicon oxide and silicon oxynitride.

9. An electronic device, comprising the encapsulation structure according to claim 1.

10. An encapsulation method, comprising:
    forming an inorganic layer;
    forming an aluminum carbon layer, wherein the aluminum carbon layer is on the inorganic layer and contacts with the inorganic layer; and
    forming an organic layer, wherein the organic layer is on the aluminum carbon layer and contacts with the aluminum carbon layer, wherein after forming the inorganic layer and before forming the aluminum carbon layer, the encapsulation method further comprises:

forming an aluminum film, wherein the aluminum film is on the inorganic layer and contacts with the inorganic layer;

forming an organic material layer, wherein the organic material layer is on the aluminum film and contacts with the aluminum film; and performing a process of heating, so that the aluminum film reacts with the organic material layer to form the aluminum carbon layer and the organic layer, wherein the organic material layer comprises a group $-((CH_2)_m\ O-)_n$, and both m and n are positive integers, the aluminum film reacts with the group $-((CH_2)_m\ O-)_n$ on a surface, contacting with the aluminum film, of the organic material layer to form the aluminum carbon layer.

11. The encapsulation method according to claim 10, wherein m=2, n=1-6.

12. The encapsulation method according to claim 10, wherein the inorganic layer comprises an aluminum oxide layer, and the aluminum carbon layer is on the aluminum oxide layer and contacts with the aluminum oxide layer.

13. The encapsulation method according to claim 10, wherein all of the aluminum film reacts with the organic material layer to form the aluminum carbon layer and the organic layer.

14. The encapsulation method according to claim 10, wherein the inorganic layer comprises a first inorganic layer and an aluminum metal layer on the first inorganic layer, and the aluminum carbon layer is on the aluminum metal layer and contacts with the aluminum metal layer.

15. The encapsulation method according to claim 14, wherein the aluminum film is on the first inorganic layer; one portion, close to the organic material layer, of the aluminum film reacts with the organic material layer to form the aluminum carbon layer and the organic layer, and the other portion, close to the first inorganic layer, of the aluminum film does not react with the organic material layer; the other portion, which does not react with the organic material layer, of the aluminum film is used as the aluminum metal layer.

16. The encapsulation method according to claim 14, wherein the first inorganic layer comprises aluminum oxide.

17. The encapsulation method according to claim 10, wherein the organic material layer comprises an organic solvent, and the organic solvent comprises the group $-((CH_2)_m\ O-)_n$.

18. The encapsulation method according to claim 10, comprising: performing the process of heating, so that the organic material layer is solidified and the aluminum film reacts with the organic material layer to form the aluminum carbon layer and the organic layer at the same time.

19. The encapsulation method according to claim 18, wherein the performing the process of heating comprises: performing a process of vacuum heating.

20. The encapsulation method according to claim 10, further comprising:

performing a plasma treatment on the inorganic layer after forming the inorganic layer.

\* \* \* \* \*